United States Patent
Kim et al.

(10) Patent No.: US 12,062,402 B2
(45) Date of Patent: Aug. 13, 2024

(54) NON-VOLATILE MEMORY DEVICE FOR PERFORMING PRECHARGE TO CELL STRING AND PROGRAM METHOD THEREOF

(71) Applicant: SAMSUNG ELECTRONICS CO., LTD., Suwon-si (KR)

(72) Inventors: Byungsoo Kim, Yongin-si (KR); Hyunggon Kim, Hwaseong-si (KR); Kyungsoo Park, Busan (KR); Sejin Baek, Yongin-si (KR); Sangbum Yun, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/385,493

(22) Filed: Jul. 26, 2021

(65) Prior Publication Data
US 2022/0139473 A1 May 5, 2022

(30) Foreign Application Priority Data
Nov. 5, 2020 (KR) .................. 10-2020-0147153

(51) Int. Cl.
| | |
|---|---|
| G11C 16/26 | (2006.01) |
| G11C 16/04 | (2006.01) |
| G11C 16/08 | (2006.01) |
| G11C 16/10 | (2006.01) |
| G11C 16/24 | (2006.01) |
| G11C 16/30 | (2006.01) |
| G11C 16/34 | (2006.01) |

(52) U.S. Cl.
CPC ...... *G11C 16/3459* (2013.01); *G11C 16/0433* (2013.01); *G11C 16/08* (2013.01); *G11C 16/102* (2013.01); *G11C 16/24* (2013.01); *G11C 16/26* (2013.01); *G11C 16/30* (2013.01)

(58) Field of Classification Search
CPC . G11C 16/3459; G11C 16/0433; G11C 16/08; G11C 16/24; G11C 16/26; G11C 16/30
USPC .................................................. 365/185.22
See application file for complete search history.

(56) References Cited

U.S. PATENT DOCUMENTS

| | | | |
|---|---|---|---|
| 6,134,140 A * | 10/2000 | Tanaka | G11C 16/345 365/185.17 |
| 7,145,806 B2 | 12/2006 | Kawai | |
| 8,031,530 B2 | 10/2011 | Joo | |
| 8,582,365 B2 | 11/2013 | Kim | |
| 9,013,924 B2 * | 4/2015 | Yang | G11C 16/0483 365/185.17 |

(Continued)

*Primary Examiner* — Connie C Yoha
(74) *Attorney, Agent, or Firm* — Sughrue Mion, PLLC

(57) ABSTRACT

A non-volatile memory device including a memory cell array including a plurality of cell strings, wherein each cell string of the plurality of cell stings includes a string selection transistor, a plurality of memory cells, and a ground selection transistor connected in series between a bit line and a common source line; and a control circuit configured to perform a program operation on a selected memory cell from among the plurality of memory cells and pre-charge a selected cell string including the selected memory cell in a pre-charge section included in a verification section, wherein the selected cell string is pre-charged as a first pre-charge voltage is applied to a selected bit line connected to the selected memory cell.

7 Claims, 16 Drawing Sheets

(56) References Cited

U.S. PATENT DOCUMENTS

| | | |
|---|---|---|
| 9,147,478 B2 | 9/2015 | Park |
| 9,159,435 B2 | 10/2015 | Yang et al. |
| 9,183,939 B2 | 11/2015 | Nam et al. |
| 9,230,659 B2 * | 1/2016 | Choi ................. G11C 16/10 |
| 9,336,883 B2 | 5/2016 | Lee et al. |
| 9,627,087 B2 * | 4/2017 | Kato ................. G11C 16/10 |
| 9,672,924 B2 | 6/2017 | Cho et al. |
| 9,761,291 B2 | 9/2017 | Joo |
| 10,541,037 B2 * | 1/2020 | Zhao ................. H10B 41/27 |
| 10,629,267 B2 * | 4/2020 | Lee ................. G11C 16/0483 |
| 10,770,157 B1 * | 9/2020 | Chen ................. G11C 16/26 |
| 10,790,003 B1 * | 9/2020 | Chen ................. G11C 11/40626 |
| 11,501,836 B2 * | 11/2022 | Chai ................. G11C 16/24 |
| 2020/0143890 A1 | 5/2020 | Lee |
| 2023/0138601 A1 * | 5/2023 | Nam ................. G11C 16/26 |
| | | 365/185.23 |
| 2023/0143341 A1 * | 5/2023 | Kim ................. G06F 3/0619 |
| | | 711/154 |

* cited by examiner

NON-VOLATILE MEMORY DEVICE FOR PERFORMING PRECHARGE TO CELL STRING AND PROGRAM METHOD THEREOF

CROSS-REFERENCE TO RELATED APPLICATION

This application is based on and claims priority under 35 U.S.C. § 119 to Korean Patent Application No. 10-2020-0147153, filed on Nov. 5, 2020, in the Korean Intellectual Property Office, the disclosure of which is incorporated by reference herein in its entirety.

BACKGROUND

The disclosure relates to a non-volatile memory, and more particularly, to a non-volatile memory device for performing pre-charge of a cell string and a program method of the non-volatile memory device.

Examples of a program method performed by a non-volatile memory device, for example, a NAND flash memory, may include Incremental Step Pulse Programming (ISPP). According to the ISPP method, program loops may be executed until a program is completed. Each program loop may include a program operation, a verification operation, and a recovery operation of initializing channels of cell strings.

In this case, channels of memory cells that are adjacent to a channel of a memory cell, on which a program is completed, are negatively boosted, and thus, a disturbance may occur. Also, a read pass voltage may be applied to a word line of the memory cell, on which the program is completed, after a verification operation, and a read disturbance may occur in an adjacent memory cell.

SUMMARY

Provided are a non-volatile memory device for performing pre-charge of a cell string in a verification section after a program operation, and a program method of the non-volatile memory device.

In accordance with an aspect of the disclosure, a non-volatile memory device includes a memory cell array including a plurality of cell strings, wherein each cell string of the plurality of cell strings includes a string selection transistor, a plurality of memory cells, and a ground selection transistor connected in series between a bit line and a common source line; and a control circuit configured to perform a program operation on a selected memory cell from among the plurality of memory cells and pre-charge a selected cell string including the selected memory cell in a pre-charge section included in a verification section, wherein the selected cell string is pre-charged as a first pre-charge voltage is applied to a selected bit line connected to the selected memory cell.

In accordance with an aspect of the disclosure, a non-volatile memory device includes a memory cell array including a plurality of cell strings, wherein each cell string of the plurality of cell strings includes a string selection transistor, a plurality of memory cells, and a ground selection transistor connected in series between a bit line and a common source line; and a control circuit configured to perform a program operation on a selected memory cell from among the plurality of memory cells and pre-charge a selected cell string including the selected memory cell in a pre-charge section included in a verification section, wherein the selected cell string is pre-charged as a first pre-charge voltage is applied to a selected common source line connected to the selected memory cell.

In accordance with an aspect of the disclosure, a program method of a non-volatile memory a plurality of cell strings, wherein each cell string of the plurality of cell strings includes a string selection transistor, a plurality of memory cells, and a ground selection transistor connected in series between a bit line and a common source line, includes performing a program operation on a selected memory cell from among the plurality of memory cells; and performing a program verification operation on the selected memory cell, wherein the program verification operation includes pre-charging a selected cell string including the selected memory cell before a recovery section, and wherein the selected cell string is pre-charged as a first pre-charge voltage is applied to a selected bit line connected to the selected memory cell, or as a second pre-charge voltage is applied to a selected common source line connected to the selected memory cell.

BRIEF DESCRIPTION OF THE DRAWINGS

The above and other aspects, features, and advantages of certain embodiments of the present disclosure will be more apparent from the following detailed description taken in conjunction with the accompanying drawings in which.

DETAILED DESCRIPTION OF THE EMBODIMENTS

Hereinafter, one or more embodiments of the inventive concept will be described in detail with reference to the attached drawings.

Figure 1:
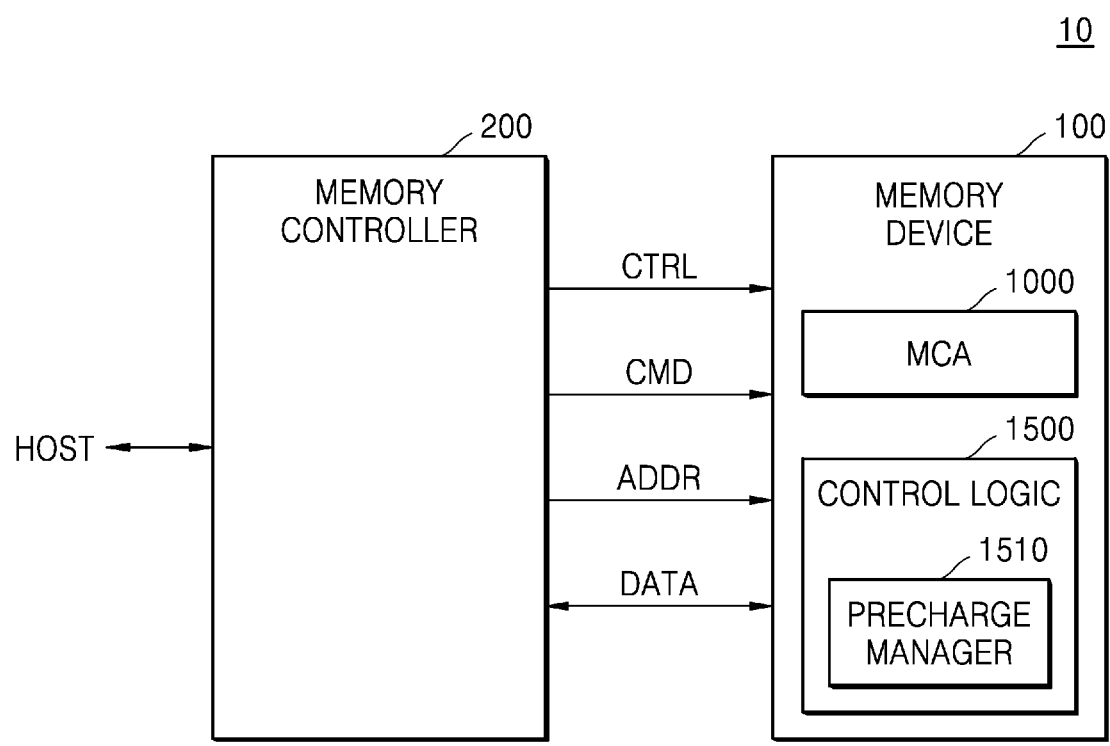
FIG. 1 is a block diagram of a storage device according to an example embodiment.

FIG. 1 is a block diagram of a storage device according to an example embodiment.

Referring to FIG. 1, a storage device 10 may include a memory device 100 and a memory controller 200.

The memory device 100 may perform an erase operation, a program operation, a read operation, or the like, according to the control of the memory controller 200. The memory device 100 receives a command CMD and an address ADDR from the memory controller 200 through input/output lines and transmits/receives data DATA for the program operation or the read operation to/from the memory controller 200. Also, the memory device 100 may receive a control signal CTRL through a control line.

In embodiments, the memory device 100 may include a memory cell array 1000 and a control logic 1500. The drawing illustrates that the memory device 100 includes one memory cell array 1000, but one or more embodiments are not limited thereto. For example, the memory device 100 may include memory cell arrays 1000. The memory cell array 1000 may include memory cells arranged in areas where word lines cross bit lines, and the memory cells may be non-volatile memory cells.

The memory device 100 may include, for example, NAND Flash Memory, Vertical NAND (VNAND), NOR Flash Memory, Resistive Random Access Memory (RRAM), Phase-Change Memory (PRAM), Magneto-resistive Random Access Memory (MRAM), Ferroelectric Random Access Memory (FRAM), Spin Transfer Torque Random Access Memory (STT-RAM), or the like.

Figure 3:
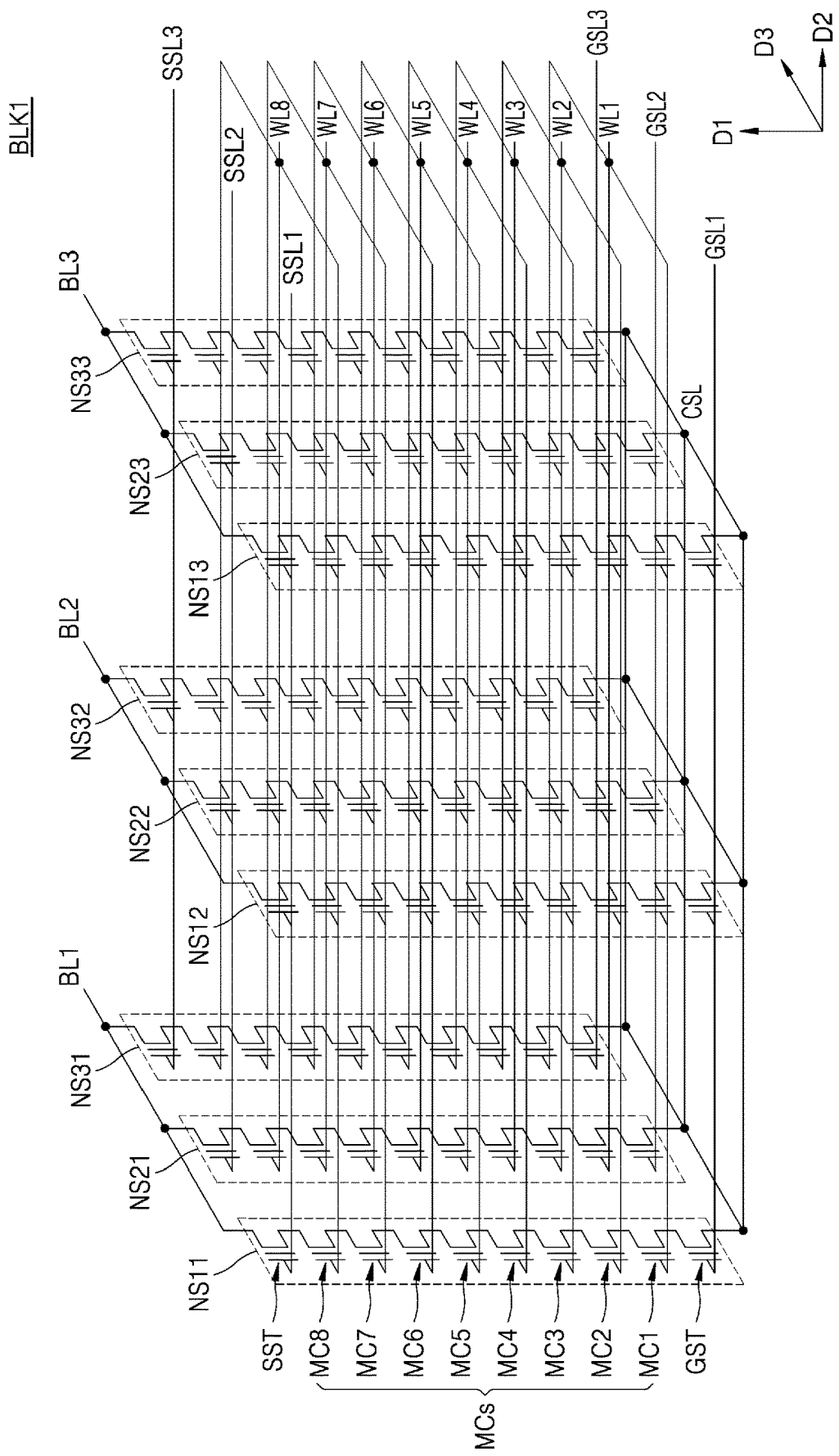
FIG. 3 is an example diagram illustrating a memory cell array according to an example embodiment.

The memory cell array 1000 may have a two-dimensional array structure or a three-dimensional array structure as illustrated in FIG. 3. Hereinafter, for convenience of explanation, the memory device 100 may be described as a non-volatile memory device. However, one or more embodiments are not limited thereto.

The memory cell array 1000 having a three-dimensional array structure is monolithically formed on at least one physical level of memory cell arrays 1000 each including an active area on a silicon substrate and a circuit formed on or in the substrate for the operation of the memory cell. The term "monolithic" may indicate that layers at each level forming the array are directly stacked on layers of each lower layer of the array. In an embodiment, the memory cell array 1000 having the three-dimensional array structure includes cell strings that are vertically arranged to make at least one memory cell be located on another memory cell. The at least one memory cell may include a charge trap layer. U.S. Pat. Nos. 7,679,133, 8,553,466, 8,654,587, 8,559,235, and US Application No. 2011/0233648, the disclosures of which are herein incorporated herein in their entirety by reference, disclose three-dimensional memory arrays configured in levels, and word lines and/or bit lines shared between the levels.

The control logic 1500 may control all operations of the memory device 100. For example, the control logic 1500 may control the memory device 100 to perform a memory operation corresponding to the command CMD provided from the memory controller 200. For example, the control logic 1500 may generate various internal control signals used in the memory device 100, in response to the control signal CTRL provided from the memory controller 200. For example, the control logic 1500 may adjust levels of voltages provided to the word lines and the bit lines when the memory operation such as the program operation or the erase operation is performed.

Figure 14:
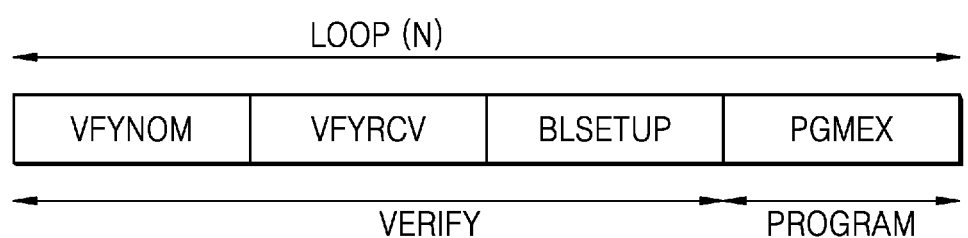
FIG. 14 is a conceptual view of a program loop according to an example embodiment.

The program or erase operation among the memory operations ay each include loops. The program operation is mainly described herein, but one or more embodiments are not limited thereto. For example, the program operation may be performed according to the ISPP method. Each program loop included in the program operation may include at least one section. For example, as illustrated in FIG. 14, one program loop may include a setup section, a program and verification section, and a recovery section.

The control logic 1500 may include a pre-charge manager 1510, and the pre-charge manager 1510 may pre-charge the cell strings of the memory cell array 1000 at uniform voltages in a pre-charge section included in the verification section.

The memory controller 200 may control the memory device 100 in response to a request from a host HOST. For example, the memory controller 200 may control the memory device 100 to read the data DATA stored in the memory device 100 or write the data DATA to the memory device 100, in response to a read/write request from the host HOST. The memory controller 200 may control the write, read, and erase operations on the memory device 100 by providing the memory device 100 with the address ADDR, the command CMD, and the control signal CTRL. Also, the data DATA used for the above operations may be exchanged between the memory controller 200 and the memory device 100. That is, the memory controller 200 may interface with the host HOST and the memory device 100.

The memory controller 200 may include random access memory (RAM), a processing unit, a host interface, and a memory interface. The RAM may be used as an operation memory of a processing unit, and the processing unit may control an operation of the memory controller 200. The host interface may include a protocol for exchanging data between the host HOST and the memory controller 200. For example, the memory controller 200 may communicate with the host HOST by using at least one of various interface protocols such as universal serial bus (USB), Multi-Media Card (MMC), Peripheral Component Interconnect-Express (PCI-E), Advanced Technology Attachment (ATA), Serial ATA (SATA), Parallel ATA (PATA), SCSI, Enhanced Small Disk Interface (ESDI), and Integrated Drive Electronics (IDE).

Figure 2:
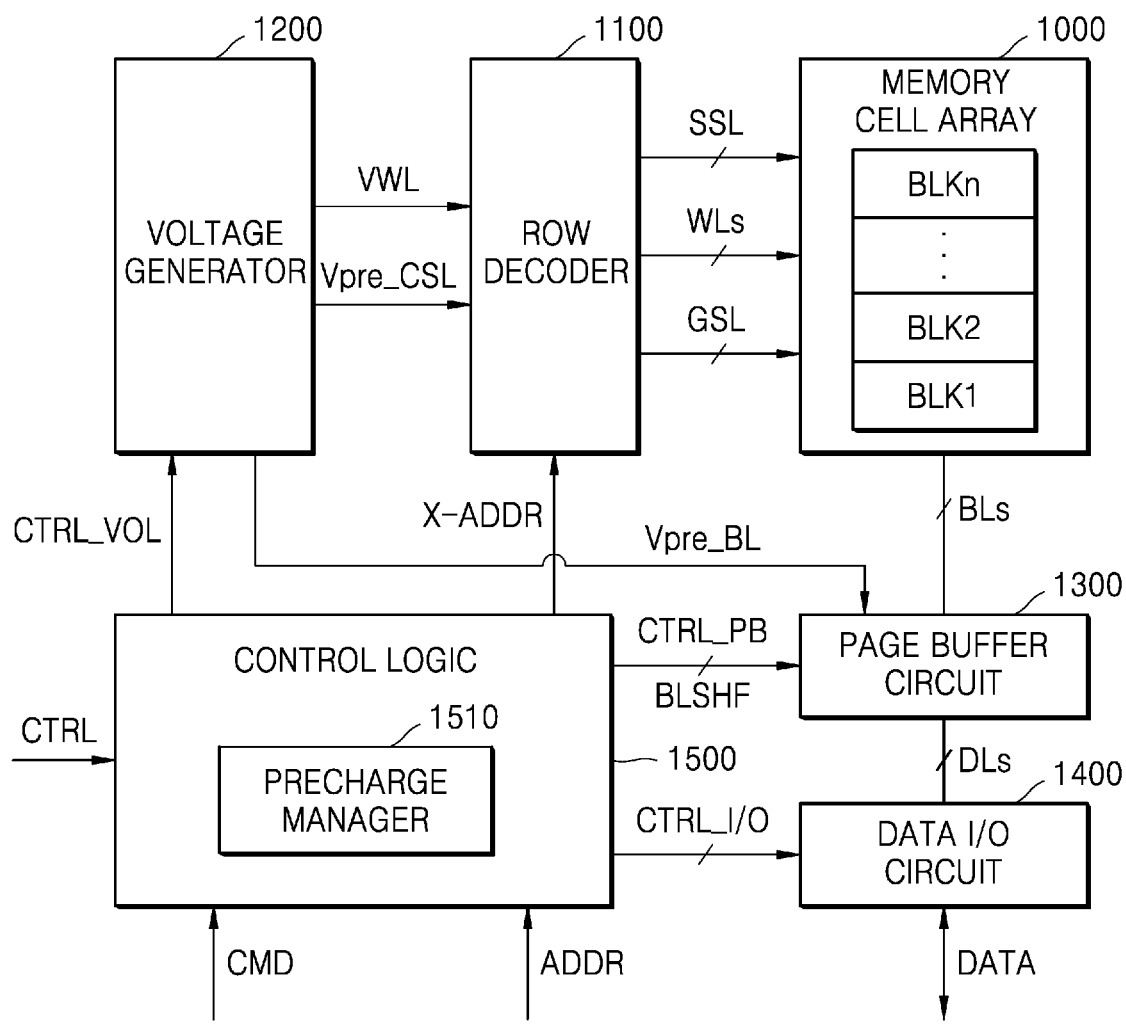
FIG. 2 is a block diagram of a memory device according to an example embodiment.

FIG. 2 is a block diagram of a memory device according to an example embodiment.

Referring to FIG. 2, the memory device 100 may include the memory cell array 1000, a row decoder 1100, a voltage generator 1200, a page buffer circuit 1300, a data input/output circuit 1400, and the control logic 1500. The memory device 100 may further include a configuration such as a column decoder.

The memory cell array 1000 may include memory blocks, for example memory blocks BLK1, BLK2, and BLKn. Each memory block may include memory cells. Each memory cell may be a multi-level cell MLC storing at least two bits of data. For example, each memory cell may be a two-bit multi-level cell MLC storing two bits of data, a triple-level cell TLC storing three bits of data, a quadruple-level cell QLC storing four bits of data, or a multi-level cell storing five or more bits of data. However, one or more embodiments are not limited thereto. For example, some memory cells may be single-level cells SLC storing one bit of data, and others thereof may be multi-level cells.

The memory cell array 1000 may be connected to the row decoder 1100 through word lines WLs, string selection lines SSL, and ground selection lines GSL, and may be connected to the page buffer circuit 1300 through bit lines BLs.

The memory cell array 1000 may include strings connected to the bit lines BLs. Each string may include at least one string selection transistor SST connected in series between the bit line BL and a common source line CSL, memory cells MCs, and at least one ground selection transistor GST. Each string may further include at least one dummy cell between the string selection transistor SST and the memory cells MCs and at least one dummy cell between the ground selection transistor GST and the memory cells MCs.

The row decoder 1100 may select some of the word lines WLs according to a row address X-ADDR, The row decoder 1100 may transmit a word line application voltage to the word line WL. During a data write operation, the row decoder 1100 may apply a program voltage and a verification voltage to a selected selection word line and a program inhibit voltage to an unselected word line. During a data read operation, the row decoder 1100 may transmit a read voltage to a selected word line and the read inhibit voltage to the unselected word line. Also, the row decoder 1100 may select some of the string selection lines SSLs or some of the ground selection lines GSLs, based on the row address X-ADDR.

The voltage generator 1200 may generate various types of voltages to perform the write, read, and erase operations on the memory cell array 1000, according to a voltage control signal CTRL_VOL. For example, the voltage generator 1200 may generate a word line driving voltage VWL for driving the word lines WLs. In this case, the word line driving voltage VWL may be a program voltage, a read voltage, an erase voltage, an inhibit voltage, a recovery voltage, or a program verification voltage.

Although not shown, the voltage generator 1200 may further generate a string selection line driving voltage VSSL for driving the string selection lines SSLs and a ground selection line driving voltage VGSL for driving the ground selection lines GSLs.

Also, the voltage generator 1200 may generate voltages for pre-charging the cell strings in a pre-charge section included in the verification section. For example, a bit line pre-charge voltage Vpre_BL for pre-charging the bit lines BLs may be generated, and a CSL pre-charge voltage Vpre_CSL for pre-charging the common source line CSL may be generated.

The voltage generator 1200 may transmit the bit line pre-charge voltage Vpre_BL to the page buffer circuit 1300 and the CSL pre-charge voltage Vpre_CSL to the row decoder 1100.

The page buffer circuit 1300 may be connected to the memory cell array 1000 through the bit lines BLs and may perform the data write operation or data read operation in response to a page buffer control signal CTRL_PB received from the control logic 1500. The page buffer circuit 1300 may be connected to the data lines DLs by selecting the bit lines BLs by using a decoded column address. The number of data lines DLs may be less than that of bit lines BLs.

The page buffer circuit 1300 may include page buffers for storing data to be programmed during the data write operation or storing data that is read during the data read operation.

Each page buffer may pre-charge the cell strings connected to the bit line BL, according to the bit line pre-charge voltage Vpre_BL.

The data input/output circuit 1400 may be connected to the page buffer circuit 1300 through the data lines DLs, provide input data DATA to the page buffer circuit 1300, or output the data DATA, which is provided from the page buffer circuit 1300, to the outside.

The control logic 1500 may output various internal control signals for storing data in the memory cell array 1000 or reading the data from the memory cell array 1000, according to the command CMD, the address ADDR, and the control signal CTRL received from the memory controller, for example memory controller 200 in FIG. 1. Various internal control signals output from the control logic 1500 may be provided to the row decoder 1100, the voltage generator 1200, the page buffer circuit 1300, and the data input/output circuit 1400. For example, the control logic 1500 may provide the row address X-ADDR to the row decoder 1100, the voltage control signal CTRL_VOL to the voltage generator 1200, the page buffer control signal CTRL_PB including a first control signal BLSHF to the page buffer circuit 1300, and an input/output control signal CTRL_I/O to the data input/output circuit 1400. Types of control signals are not limited thereto, and the control logic 1500 may further provide other internal control signals. For example, the control logic 1500 may provide a column address to the column decoder.

The pre-charge manager 510 may control various signals for pre-charging the cell strings in part of the verification section. The aforementioned part may be referred to as a pre-charge section. For example, the pre-charge section may be formed in a latter part of the verification section.

For example, the pre-charge manager 1510 may provide the page buffer circuit 1300 with the page buffer control signal CTRL_PB including the first control signal BLSHF to provide the bit line pre-charge voltage Vpre_BL to the bit lines BLs. As another example, a row address X-ADDR for selecting a certain cell string may be provided to the row decoder 1100 to pre-charge a certain cell string. That is, the pre-charge manager 1510 may select a cell string used for the pre-charge, by transmitting a control signal to the string selection transistor SST or the ground selection transistor GST.

FIG. 3 is an example diagram illustrating a memory cell array according to an example embodiment.

FIG. 3 may be a circuit diagram corresponding to the memory block of FIG. 2, according to embodiments. The memory block of FIG. 3 is an example of the memory blocks BLK1, BLK2, and BLKn described with reference to FIG. 2, and FIG. 3 illustrates the first memory block BLK1. The first memory block BLK1 is a three-dimensional memory block having a three-dimensional structure on a substrate. Memory cell strings included in the first memory block BLK1 may be formed in a direction D1 perpendicular to the substrate.

Referring to FIGS. 2 and 3, the first memory block BLK1 may include cell strings NS11 to NS33, word lines WL1 to WL8, bit lines BL1 to BL3, ground selection lines GSL1 to GSL 3, string selection lines SSL1 to SSL3, and a common source line CSL. FIG. 3 illustrates that each of the cell strings NS11 to NS33 includes eight memory cells MCs respectively connected to eight word lines WL1 to WL8, but one or more embodiments are not limited thereto.

Each of the cell strings NS11 to NS33 may include the string selection transistor SST, the memory cells MCs, and the ground selection transistor GST connected in series. The string selection transistor SST may be connected to a corresponding string selection line SSL1 The memory cells MCs may be respectively connected to the corresponding word lines WL1 to WL8. The ground selection transistor GST may be connected to a corresponding ground selection line GSL1. The string selection transistor SST may be connected to the corresponding bit line BL1, and the ground selection transistor GST may be connected to the common source line CSL. Although not shown, as described above with reference to FIG. 2, at least one dummy cell may be included between the string selection transistor SST and the memory cells MCs, and at least one dummy cell may be further included between the ground selection transistor GST and the memory cells MCs.

The word line, for example the word line WL1, at the same height may be commonly connected to the cell strings NS11 to NS33, and the ground selection lines GSL1 to GSL 3 and the string selection lines SSL1 to SSL3 may be separated. According to the present embodiment, some of the cell strings may only be selected and pre-charged in the pre-charge section by controlling the ground selection lines GSL1 to GSL3 or the string selection lines SSL1 to SSL3.

When performing the program operation, the memory device 100 according to an embodiment may pre-charge the cell strings at certain voltages in the pre-charge section included in the verification section.

During an ISPP program operation according embodiments, a memory cell, for example the memory cell MC1, close to the common source line CSL may be programmed first, and then, the programming may be performed in a D1 direction closer to the string selection line SSL. However, the programming direction is not limited thereto. A memory cell, for example the memory cell MC8, adjacent to the string selection line SSL may be programmed first, and then the programming may be performed in a downward direction. Hereinafter, for convenience, a program operation of a selected memory cell MC4 is described as being performed in the cell string NS11 connected to the bit line BL1, however embodiments are not limited thereto.

Channels of the memory cells MC5 to MC8 arranged above the selected memory cell MC4, on which the program is completed, may be in a floating state, and voltages of the channels in the floating state may be reduced to a negative level because of an influence of the selected memory cell MC4. Such reduction may be referred to as negative boosting. Because of the negative boosting, a difference between voltages of the channels of the memory cells MC1 to MC3 arranged under the selected memory cell MC4 and the channels of the memory cells MC5 to MC8 increases, and thus, the memory cells MCs may deteriorate because of hot carrier injection.

According to an embodiment, the program operation of the selected memory cell MC4 may be completed, and a voltage of a channel of a cell string including the selected memory cell MC4 may be pre-charged in the latter part of the verification section before the recovery operation is performed. For convenience, the cell string including the selected memory cell MC4 may be referred to as a selected cell string NS11. For example, the selected cell string NS11 may be pre-charged, but one or more embodiments are not limited thereto. Other cell strings NS21 and NS31 connected to the bit line BL1 connected to the selected cell string NS11 may also be pre-charged. In addition, all of the cell strings NS11 to NS33 connected to the common source line CSL may be pre-charged as well.

To this end, because a next operation may be performed while a voltage of a channel above the selected word line WL4 increases, the negative boosting may be restricted, and thus, the deterioration in the memory cell may be prevented.

Also, according to embodiments, in the verification section after the program operation of the selected memory cell MC4 is completed, the read pass voltage Vread may be applied to the word line NS11 of the selected memory cell MC4 and the word lines of the unselected memory cells MC1 to MC3 and MC5 to MC8. The read pass voltage Vread, which is applied to the selected word line WL4 for a certain period of time after the program operation is completed, may be referred to as a post pulse.

In this case, read disturbance may occur in word lines, for example the word lines WL3 and WL5, which are adjacent to the selected word line WL4 from among the unselected word lines WL1 to WL3 and WL5 to WL8, because of coupling caused by the post pulse.

According to the present embodiment, while the cell string is pre-charged, a certain voltage may be applied to the selected word line WL4 as well as the adjacent word lines WL3 and WL5, which are adjacent to the selected word line WL4, thereby preventing the coupling caused by the post pulse. It is illustrated that there are two adjacent word lines, but one or more embodiments are not limited thereto. The number of word lines does not have to be symmetrical with respect to a selected word line.

Figure 4:
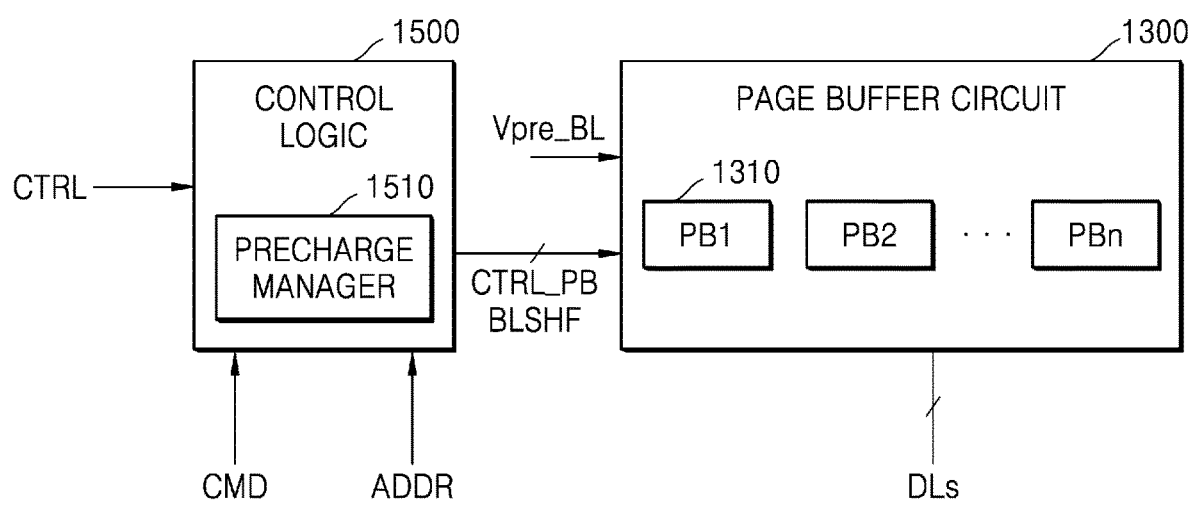
FIG. 4 is a block diagram of a memory device according to an example embodiment.

FIG. 4 is a block diagram of a memory device according to an example embodiment.

Referring to FIGS. 2 and 4, the page buffer circuit 1300 may include page buffers PB1, PB2, and PBn. Each of the page buffers PB1, PB2, and PBn may be connected to some of the bit lines BLs. Each of the page buffers PB1, PB2, and PBn may include latches such as a sensing latch, a data latch, and a cache latch and may further include a pre-charge circuit and a bit line selection circuit.

The page buffer circuit 1300 according to the present embodiment may receive the page buffer control signal CTRL_PB from the control logic 1500. The page buffer control signal CTRL_PB may control all operations of the page buffer circuit 1300, example, the page buffer control signal CTRL_PB may include the first control signal BLSHF, and a pre-charge circuit of the page buffer circuit 1300 may pre-charge a bit line at a certain voltage according to the control signal BLSHF. The certain voltage may be, for example, the bit line pre-charge voltage Vpre_BL received from the voltage generator 1200.

The control logic 1500 may generate control signals for controlling transistors constituting the pre-charge circuit included in the page buffer circuit 1300 and may provide the control signals to the page buffer circuit 1300. Thus, a time taken to apply the bit line pre-charge voltage Vpre_BL to the connected bit lines and a level of the bit line pre-charge voltage Vpre_BL may be determined.

In the pre-charge section, the page buffer circuit 1300 according to the present embodiment may provide the bit line pre-charge voltage Vpre_BL to all of the connected bit lines and thus may pre-charge the cell strings connected to the bit lines.

A method, performed by the page buffer circuit 1300, of providing the bit line pre-charge voltage Vpre_BL to the bit lines may vary. Description of two methods are provided with reference to FIGS. 5 to 8, but one or more embodiments are not limited thereto.

Figure 5:
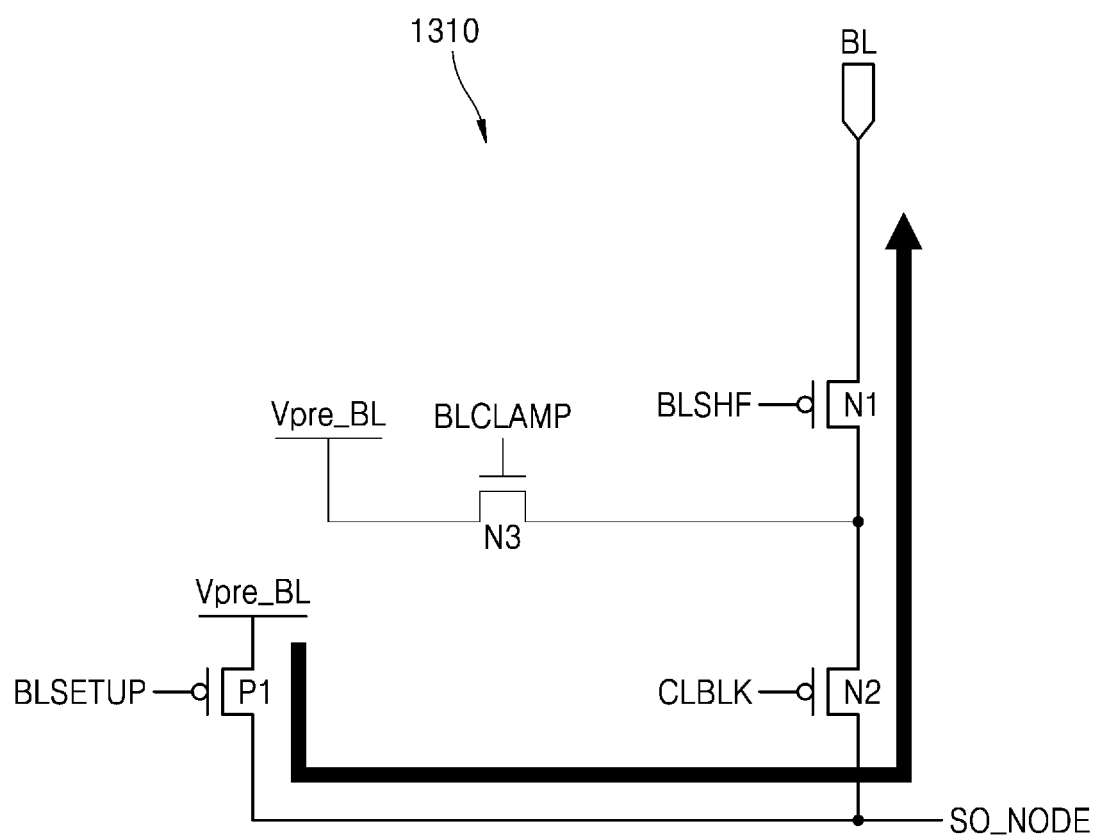
FIG. 5 is a circuit diagram of a page buffer according to an example embodiment.

FIG. 5 is a circuit diagram of a page buffer according to an example embodiment.

Referring to FIGS. 4 and 5, a page buffer 1310, which may correspond to a page buffer PB1, may include a pre-charge circuit, a bit line selection circuit, a sensing latch, a data latch, and/or the like, but only the pre-charge circuit is described herein.

The pre-charge circuit of the page buffer 1310 may include first to fourth transistors N1 to N3 and P1. The transistors N1 to N3 and P1 may be turned on or off in response to each control signal. The page buffer 1310 according to the present embodiment may include a first transistor N1 that is turned on according to a first control signal BLSHF, a second transistor N2 that is turned on according to a second control signal CLBLK, a third transistor N3 that is turned on according to a third control signal BLCLAMP, and a fourth transistor P1 that is turned on according to a fourth control signal BLSETUP. One end of the fourth transistor P1 and one end of the second transistor N2 may be connected to a sensing out node SO_NODE.

The first to third transistors N1 to N3 may be NMOS transistors. The first to third transistors N1 to N3 may be turned on when a logic-high control signal is transmitted and may be turned off when a logic-low control signal is transmitted. The fourth transistor P1 may be a PMOS transistor. The fourth transistor P1 may be turned off a logic-high control signal is transmitted and turned on when a logic-low control signal is transmitted.

For example, the pre-charge circuit may turn on the first transistor N1, the second transistor N2, and the fourth transistor P1 and turn off the third transistor N3 to provide the bit line pre-charge voltage Vpre_BL from the voltage generator to the bit line BL, To turn on the fourth transistor P1, data stored in the latch circuit connected to the fourth transistor P1 may have a specific value, for example, '1.'

Points in time, when respective transistors are turned on, or levels of turn-on voltages respectively provided to the transistors may be determined according to the page buffer control signal CTRL_PB provided from the control logic.

Figure 6:
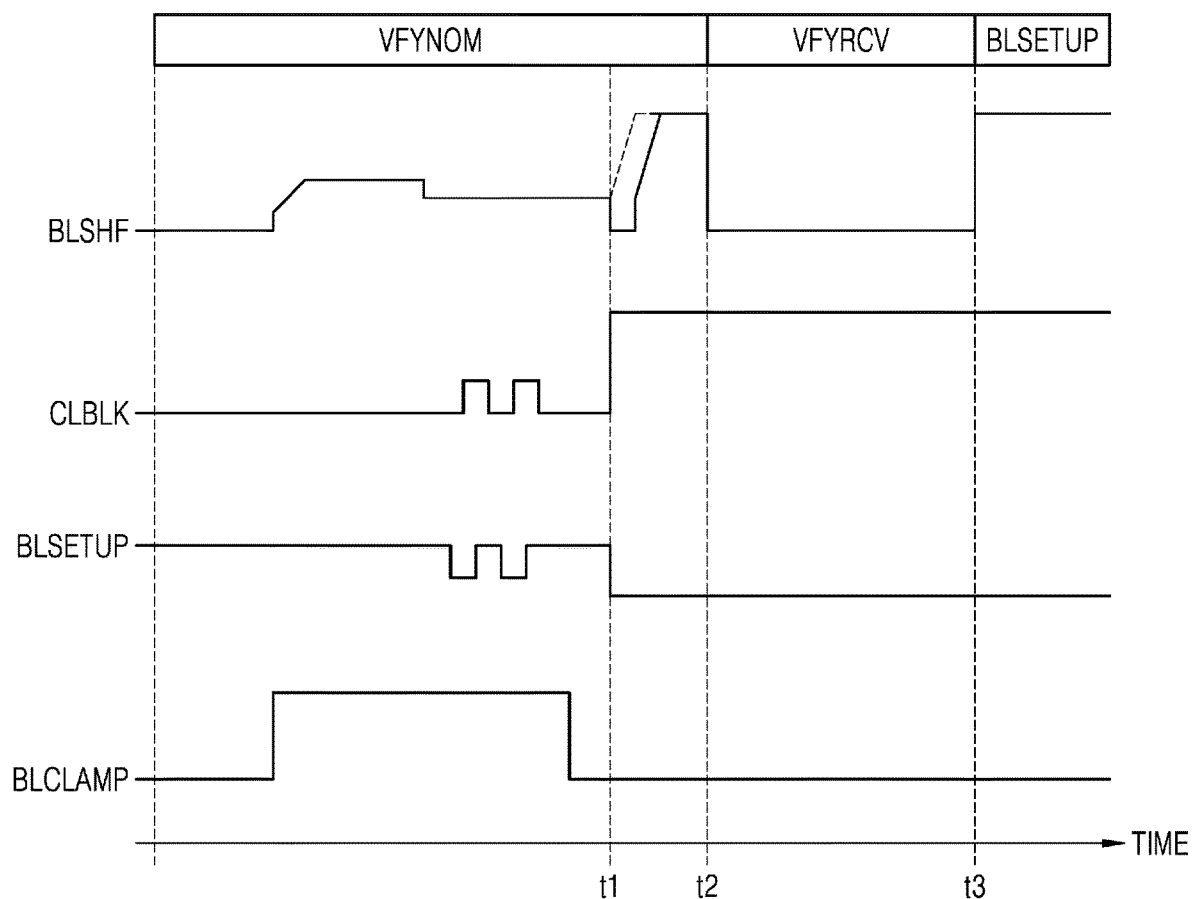
FIG. 6 is a timing diagram illustrating an operation of a page buffer, according to an example embodiment.

FIG. 6 is a timing diagram illustrating an operation of a page buffer, according to an example embodiment.

As described above with reference to FIG. 1, one program loop may include a setup section, a program and verification section, and a recovery section. For convenience, description of the program section may be omitted, and the verification section VFYNOM, the recovery section VFYRCV, and the setup section BLSETUP may be sequentially illustrated with respect to time point t1, time point t2, and time point t3, which may be points in time. Timings in the timing diagram may not be represented in a fixed ratio.

The pre-charge section may correspond to time point t1 and time point t2. For convenience of explanation, the verification section VFYNOM may be a section excluding the pre-charge section t1 to t2 and may only indicate a section up to the time point t1.

Referring to FIGS. 5 and 6, in the pre-charge section t1 to t2, a level of the first control signal BLSHF may be shifted from a turn-off level to a turn-on level as indicated by a solid line. As another example, the level of the first control signal BLSHF may be immediately changed to the turn-on level instead of being at the turn-off level at the time point t1, as indicated by a dashed line. A level of the second control signal CLBLK may be changed to the turn-on level, for example, a power voltage Vdd. A level of the fourth control signal BLSETUP may be changed to the turn-off level, for example, a ground voltage Vss. A turn-off level of the third control signal BLCLAMP may be maintained. Therefore, in the pre-charge section t1 to t2, the first transistor N1, the second transistor N2, and the fourth transistor P1 may be turned on, and thus, the bit line pre-charge voltage Vpre_BL may be provided to the connected bit line.

At the time point t2 when the recovery section VFYRCV starts, the level of the first control signal BLSHF may be changed to the turn-off level. The second control signal CLBLK, the third control signal BLCLAMP, and the fourth control signal BLSETUP may maintain their states.

The time point t1 when the pre-charge section starts and the time point t2 when the pre-charge section ends may be determined by the pre-charge manager.

Figure 7:
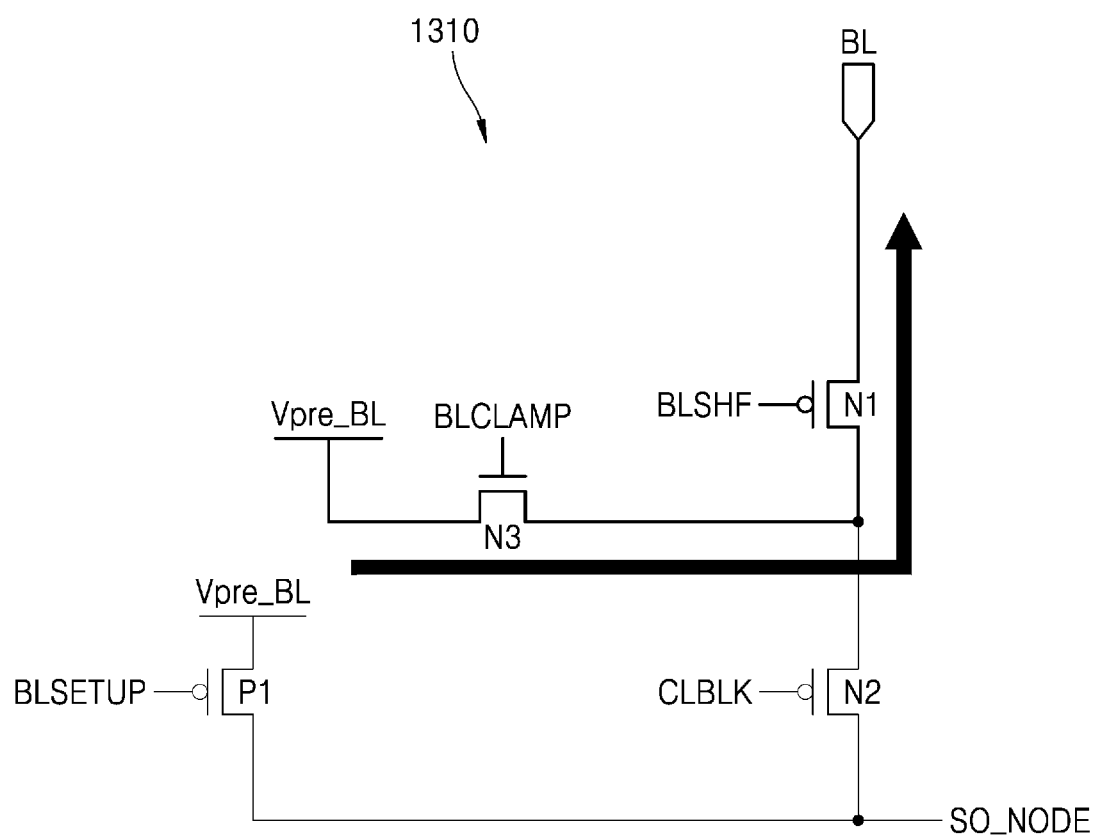
FIG. 7 is a circuit diagram of a page buffer according to an example embodiment.

FIG. 7 is a circuit diagram of a page buffer according to an example embodiment.

Duplicate descriptions provided with reference to FIG. 5 may be omitted.

Referring to FIGS. 4 and 7, the page buffer 1310 may provide the bit line pre-charge voltage Vpre_BL to the connected bit line by using a method different from that described with reference to FIGS. 5 and 6. That is, the pre-charge circuit may turn on the first transistor N1 and the third transistor N3 and may turn off the second transistor N2 and the fourth transistor P1.

Figure 8:
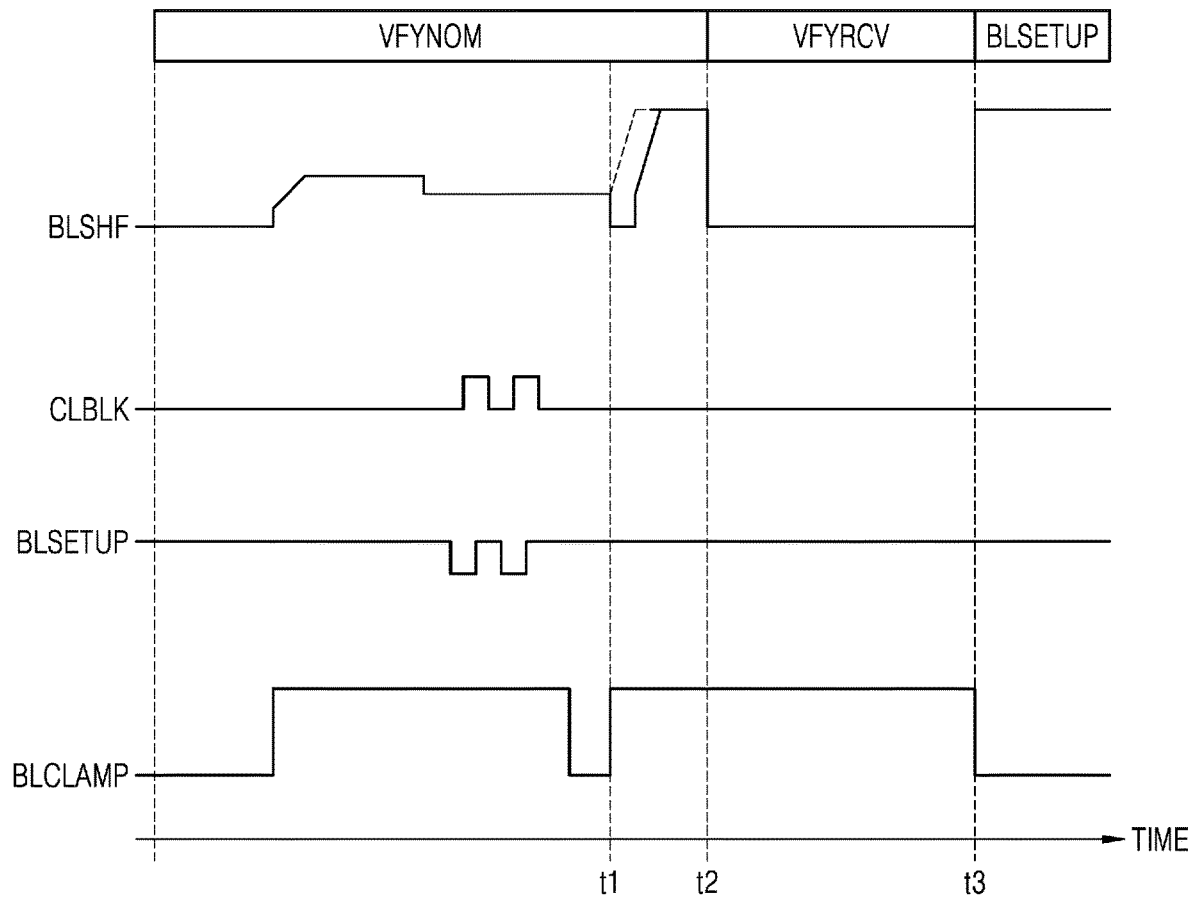
FIG. 8 is a timing diagram illustrating an operation of a page buffer, according to an example embodiment.

FIG. 8 is a timing diagram illustrating an operation of a page buffer, according to an example embodiment.

Referring to FIGS. 7 and 8, in the pre-charge section t1 to t2, the level of the first control signal BLSHF may be shifted from the turn-off level to the turn-on level, as indicated by a solid line. As another example, the level of the first control signal BLSHF may be immediately changed to the turn-on level instead of the turn-off level in the time point t1, as indicated by a dashed line. A level of the third control signal BLCLAMP may be changed to the turn-on level, for example, a power voltage Vdd. The second control signal CLBLK may keep being at the turn-off level, and a fourth control signal BLSETUP may keep being at the turn-on level.

Accordingly, the first transistor N1 and the third transistor N3 may be turned on, and the second transistor N2 and the fourth transistor P1 may be turned off. Thus, the bit line pre-charge voltage Vpre_BL may be provided through the connected bit line.

Meanwhile, the time point t1 and/or the time point t2 may be determined to be sufficient enough to pre-charge the cell strings connected to the bit line in the pre-charge section t1 to t2. For example, the sufficient amount of time may indicate a time taken to pre-charge voltages of all bit lines at the same voltage level, for example, with the bit line pre-charge voltage Vpre_BL.

Also, when the operation of pre-charging the cell strings affects the performance of the memory device, lengths of the pre-charge section t1 to t2 may be determined according to the performance of the memory device.

Hereinafter, an operation of pre-charging the cell strings connected to the bit line in the pre-charge section t1 to t2 and controlling the word line WL, the string selection line SSL, the ground selection line GSL, or the common source line CSL at the same time is described.

FIGS. 9 to 13 are timing diagrams illustrating a pre-charge operation according to an example embodiment.

Hereinafter, referring to FIG. 3 as well, an example in which a selected word line is the word line WL4 and a selected memory cell is the memory cell MC4 is described.

Figure 9:
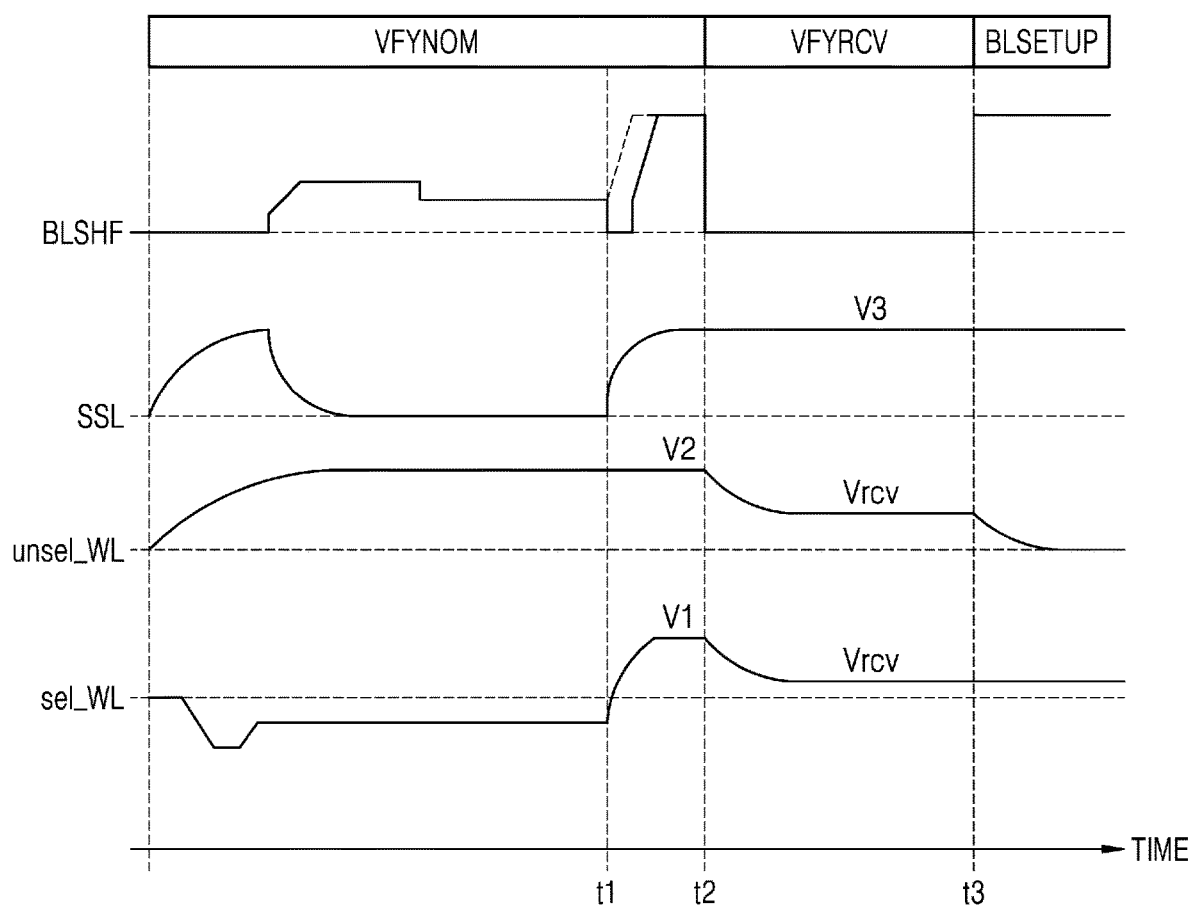
FIGS. 9 to 13 are timing diagrams illustrating a pre-charge operation according to an example embodiment.

Referring to FIGS. 3 and 9, in the pre-charge section t1 to t2, the level of the control signal BLSHF may be the turn-off level and then the turn-on level, as indicated by a solid line. As indicated by a dashed line, the level of the control signal BLSFHF may not be the turn-off level in the pre-charge section, but may be immediately changed to the turn-on level in the time point t1.

In the pre-charge section t1 to t2, the bit line and the cell suing may be pre-charged through a pre-charge circuit of a page buffer. When the pre-charge circuit is connected to all bit lines BL1 to BL3, the bit line pre-charge voltage Vpre_BL may be provided to the bit lines BL1 to BL3, and thus, all cell strings NS1 to NS33 connected to the bit lines BL1 to BL3 may be pre-charged.

In the pre-charge section t1 to t2, a first voltage V1 may be applied to a selected word line sel_WL while a negative voltage is applied thereto. For example, the first voltage V1 may be the read pass voltage Vread or the power voltage Vdd. A second voltage V2 of unselected word lines unsel_WL, for example the word lines WL1 to WL3 and WL5 to WL8, may be maintained. For example, the second voltage V2 may be the read pass voltage Vread and may be identical to the first voltage V1 or may have a different value from the first voltage V1. In the pre-charge section t1 to t2, a third voltage V3 may be applied to the string selection lines SSL. As the third voltage V3 is applied, the string selection transistor SST connected to the string selection line SSL may be turned on.

For example, as the string selection transistor SST is turned on, the bit line pre-charge voltage Vpre_BL applied to the bit line BL1 may be used to pre-charge the selected cell string NS11 connected to the bit line BL1.

Then, in a recovery section VFYRCV, the recovery voltage Vrcv may be applied to the selected word line sel_WL and the unselected word lines unsel_WL.

Although not shown, in the pre-charge section t1 to t2, a turn-on voltage or a turn-off voltage may be applied to the ground selection line GSL. According to whether the ground selection transistor GST is turned on, a voltage of the common source line CSL may have a certain voltage level or may be in a floating state.

For example, when the turn-on voltage is applied to the ground selection line GSL, the ground selection transistor GST may be turned on, and charges of a pre-charged cell string may flow into the common source line CSL, thus pre-charging the common source line CSL.

As another example, when the turn-off voltage is applied to the ground selection line GSL, the ground selection transistor GST may be turned off, and the charges of the pre-charged cell string may not flow into the common source line CSL. Therefore, the common source line CSL may have a constant voltage, for example, 0 V, regardless of whether the cell string is pre-charged.

Referring to FIG. 9, the read pass voltage Vread or the turn-on voltage may be applied to the string selection lines SSL1 to SSL3 for a first time in an initial part of the verification section VFYNOM, and the ground voltage Vss or the turn-off voltage may be applied to the string selection lines SSL1 to SSL3 for a second time. In this case, a voltage applied for the first time may be referred to as a pre-pulse.

Referring to FIGS. 3 to 10, unlike the illustration of FIG. 9, the pre-pulse may not be applied to the string selection lines SSL1 to SSL3 in the initial part of the verification section VFYNOM. Except the fact that the pre-pulse is not applied to the string selection lines SSL1 to SSL3, other conditions are the same as those described with reference to FIG. 9, and thus, the descriptions thereof will not be repeated.

The turn-on voltage may be applied to the string selection line SSL1 in the initial part of the verification section VFYNOM, and the turn-on voltage may be maintained in the pre-charge section t1 to t2 and the recovery section VFYRCV.

The turn-on voltage may be applied to unselected string selection lines SSL2 and SSL3 for a certain period of time in the initial part of the verification section VFYNOM, and then the turn-off voltage may be applied thereto. In the pre-charge section t1 to t2, the turn-on voltage may be applied again to the unselected string selection lines SSL2 and SSL3.

Therefore, even when the pre-pulse is not applied, all string selection lines SSL1 to SSL3 may be turned on, and all of the cell strings NS11 to NS31 connected may be pre-charged.

Figure 11:
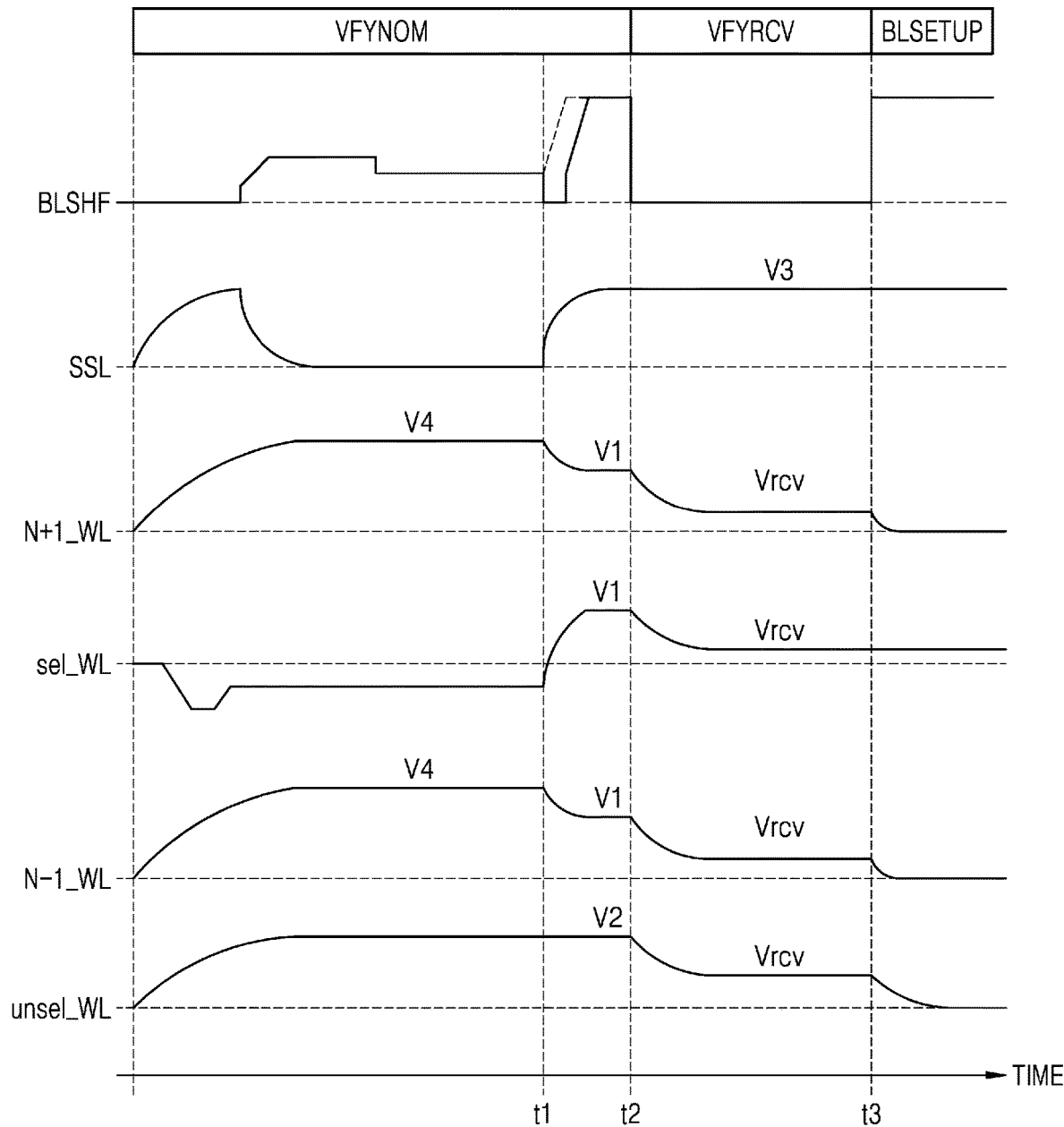

Referring to FIGS. 3 and 11, in the pre-charge section t1 to t2, a voltage, which is different from that applied to the unselected word lines unsel_WL, may be applied to adjacent word lines N−1_WL and N+1_WL that are adjacent to the selected word line sel_WL. Referring to FIG. 11, a pre-pulse may be applied to the string selection lines SSL1 to SSL3, but one or more embodiments are not limited thereto.

Figure 10:
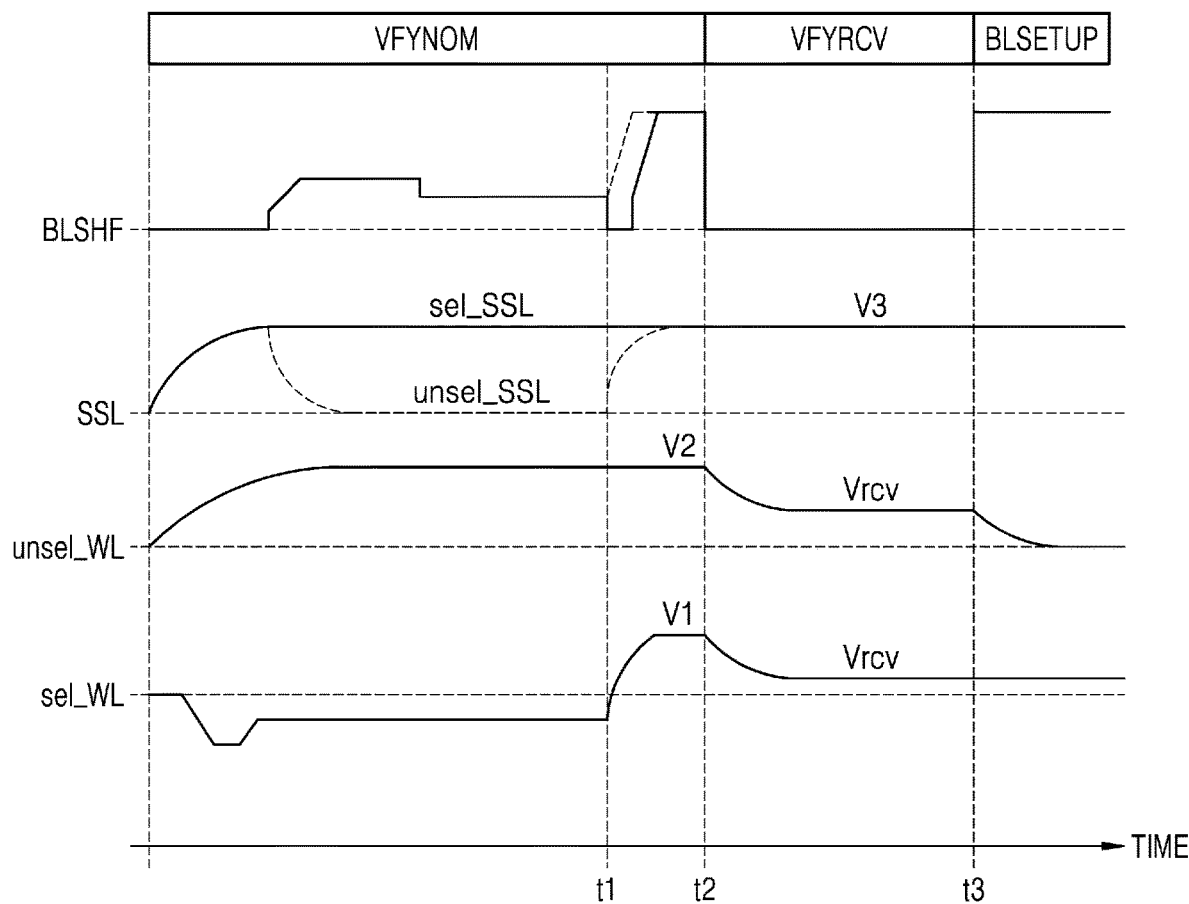

When the selected word line sel_WL is an $n^{th}$ word line, the adjacent word lines N−1_WL and N+1_WL may be the word line N−1_WL, which is adjacent under the selected word line sel_WL, and the word line N+1_WL adjacent above the selected word line sel_WL. For example, when N is equal to 2, the adjacent word lines N−1_WL and N+1_WL may be the word lines WL3 and WL5. The number of adjacent word lines N−1_WL and N+1_WL does not have to be symmetrical based on the selected word line sel_WL. For example, when N is equal to 5, the adjacent word lines N−1_WL and N+1_WL of the selected word line sel_WL may be the word lines WL2, WL3, WL5, WL6, and WL7 or the word lines WL1, WL2, WL3, WL5, and WL6. Referring to FIG. 11, the number of adjacent word lines N−1_WL and N+1_WL may be two, and duplicate descriptions provided with reference to FIGS. 9 and 10 are omitted. Also, the unselected word lines unsel_WL denote remaining word lines except the selected word line sel_WL and the adjacent word lines N−_WL and N+1_WL.

In the verification section VFYNOM, the fourth voltage V4 may be applied to the adjacent word lines N−1_WL and N+1_WL, the fourth voltage V4 having a different level from the second voltage V2 applied to the unselected word line unsel_WL. For example, the level of the fourth voltage V4 may be higher than that of the second voltage V2.

In the pre-charge section t1 to t2, the first voltage V1 may be applied to the adjacent word lines N−1_WL and N+1_WL, the first voltage V1 being identical to a voltage applied to the selected word line sel_WL. The first voltage V1 may be the power voltage Vdd, for example, 2 V. As another example, a voltage may be applied to the adjacent word lines N−1_WL and N+1_WL, the voltage having a different level from the first voltage V1 applied to the selected word line sel_WL. The second voltage V2 may be maintained in the unselected word line unsel_WL. For example, a level of the second voltage V2 may be higher than that of the first voltage V1.

Then, in the recovery section VFYRCV, the recovery voltage Vice may be applied to the word lines N−1_WL, sel_WL, N+1_WL, and unsel_WL.

According to embodiments, in the verification section VFYNOM, post pulses may be applied to the selected word line sel_WL for a certain period of time. In this case, read disturbance Disturb may occur in the adjacent word lines N−1_WL and N+1_WL because of coupling caused by the post pulses.

According to the present embodiment, a certain voltage, not the read pass voltage Vread, may be applied to the adjacent word lines N−1_WL and N+1_WL, and the selected word line sel_W to prevent the coupling that is caused as the read pass voltage Vread is applied to the unselected word lines unsel_WL.

Figure 12:
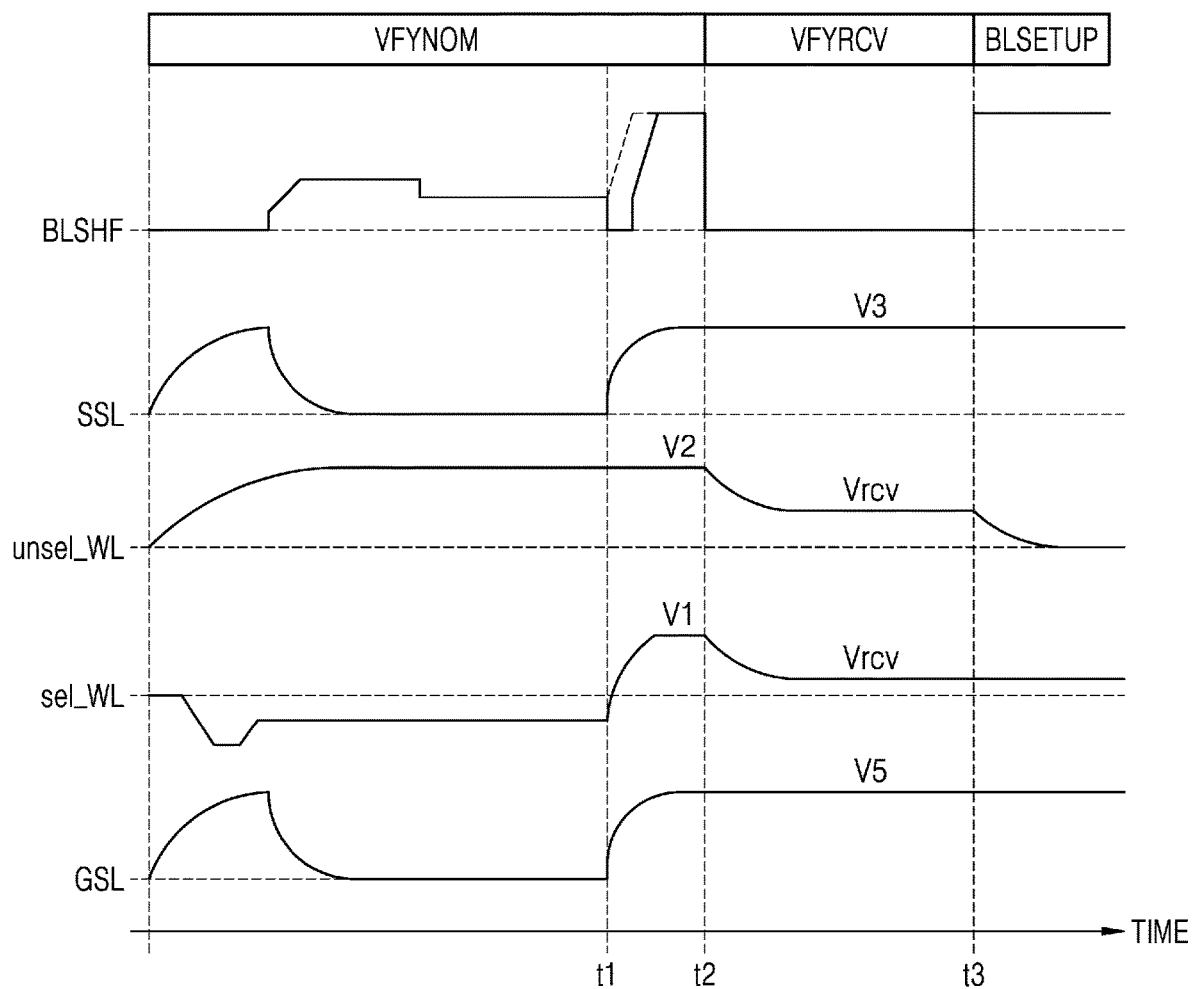

Referring to FIGS. 2, and 12, to pre-charge the cell strings NS11 to NS33, the bit line pre-charge voltage Vpre_BL may be applied to each of the connected bit lines BL1 to BL3, or the common source line CSL connected to the cell strings NS11 to NS33 may be pre-charged at a certain voltage level.

As an exemplary method of pre-charging the common source line CSL at a certain voltage level, the common source line CSL may be pre-charged because of a cell current that flows in the cell strings NS11 to NS31 as the bit line BL1 is pre-charged. In this case, the cell strings NS12 to NS33, which are not connected to the pre-charged bit line BL1, may be pre-charged as the common source line CSL is pre-charged.

As another example, regardless of whether the bit line BL1 is pre-charged, a CSL pre-charge voltage Vpre_CSL may be applied to the common source line CSL.

First of all, a case, where the common source line CSL is pre-charged because of the cell current flowing in the cell strings NS11 to NS31 as the bit line BL1 is pre-charged with the bit line pre-charge voltage Vpre_BL, is described. Duplicate descriptions provided with reference to FIGS. 9 to 11 are omitted.

In the pre-charge section t1 to t2, the fifth voltage V5 may be applied to the ground selection line GSL1. The fifth voltage V5 may be the turn-on voltage of the ground selection transistor GST. Therefore, when the ground selection transistor GST is turned on, and when the cell strings NS11 to NS31 connected to the bit line BL1 are pre-charged with the bit line pre-charge voltage Vpre_BL, a voltage of the common source line CSL connected to the cell strings NS11 to NS31 may increase. Thus, the cell strings NS12 to NS33 connected to the bit lines BL2 and BL3, to which the bit line pre-charge voltage Vpre_BL is not applied, may be pre-charged.

Figure 13:
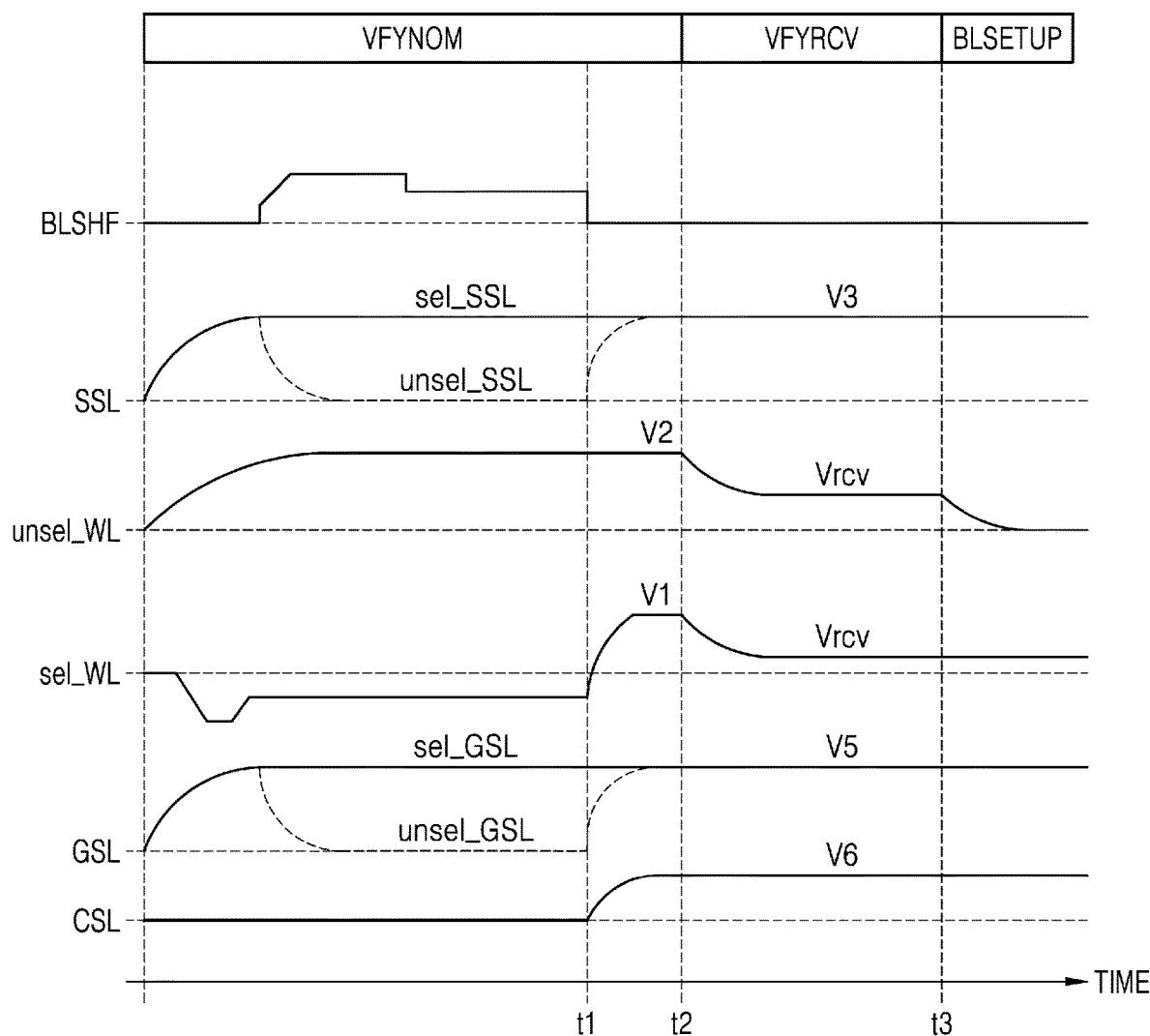

Referring to FIGS. 3 and 13, regardless of whether the bit line BL1 is pre-charged, the CSL pre-charge voltage Vpre_CSL may be applied to the common source line CSL, and thus, all of the cell strings NS11 to NS33 may be pre-charged. The CSL pre-charge voltage Vpre_CSL may be generated by the voltage generator and applied to the common source line CSL.

In the pre-charge section t1 to t2, the turn-off level of the control signal BLSHF may be maintained. In this case, the sixth voltage V6 may be applied to the common source line CSL.

As described above with reference to FIG. 12, in the pre-charge section t1 to t2, the fifth voltage V5 may be applied to the ground selection line GSL1, and the ground selection transistor GST may be turned on. Therefore, as the sixth voltage V6 pre-charged in the common source line CSL is applied to the connected cell strings NS11 to NS33, the cell strings NS11 to NS33 may be pre-charged.

In the verification section VFYNOM, the pre-pulses may not be applied to the string selection lines SSL1 to SSL3 and the ground selection lines GSL1 to GSL3. That is, when the pre-pulse is applied to at least one of an unselected string selection line unsel_SSL and an unselected ground selection line unsel_GSL, a voltage having a certain level may be applied again to connection lines, to which the pre-pulse is applied, in the pre-charge section t1 to t2.

A level of a voltage applied to a selected string selection line sel_SSL and a selected ground selection line sel_GSL, to which a voltage of a certain level has been applied in the verification section VFYNOM, in the pre-charge section t1 to t2 and the recovery section VFYRCV may be maintained.

FIG. 14 is a conceptual view of a program loop according to an example embodiment.

Referring to FIG. 14, an Nth program loop LOOP(N) may include the verification section VERIFY and the program section PROGRAM. The verification section VERIFY may include a normal verification section VFYNOM, the recovery section VFYRCV, and the setup section BLSETUP, and the program section PROGRAM may include a program execution section PGMEX. The pre-charge operation of the cell string may be performed in a tatter part of a normal verification section VFYNOM before the recovery section VFYRCV starts.

Figure 15:
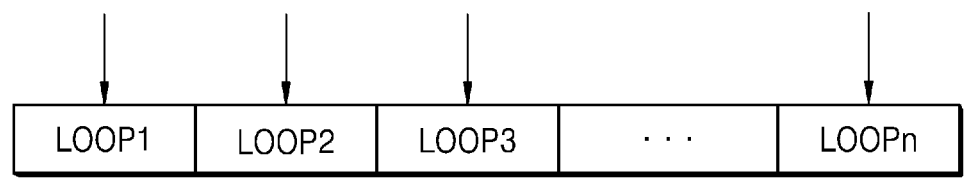
FIG. 15 is an example diagram illustrating a point in time when a pre-charge operation is performed, according to an example embodiment.

FIG. 15 is an example diagram illustrating a point in time when a pre-charge operation is performed, according to an example embodiment.

Referring to FIG. 15, program loops LOOP1, LOOP2, LOOP3, and LOOPn may be sequentially performed according to an ISPP program method.

The pre-charge of the cell string according to the present embodiment is not limited to the pre-charge performed in every program loop. That is, in at least one of n program loops, the cell string may be pre-charged at least once. Also, the pre-charge operation of the cell string does not need to repeatedly occur in consecutive program loops. For example, the cell suing may be pre-charged in a first program loop, and the cell string may be pre-charged in a third program loop.

The number of times or intervals that the cell string is pre-charged may be determined by the pre-charge manager. For example, the number of times or the intervals may be determined according to a count that the program loop is performed.

Figure 16:
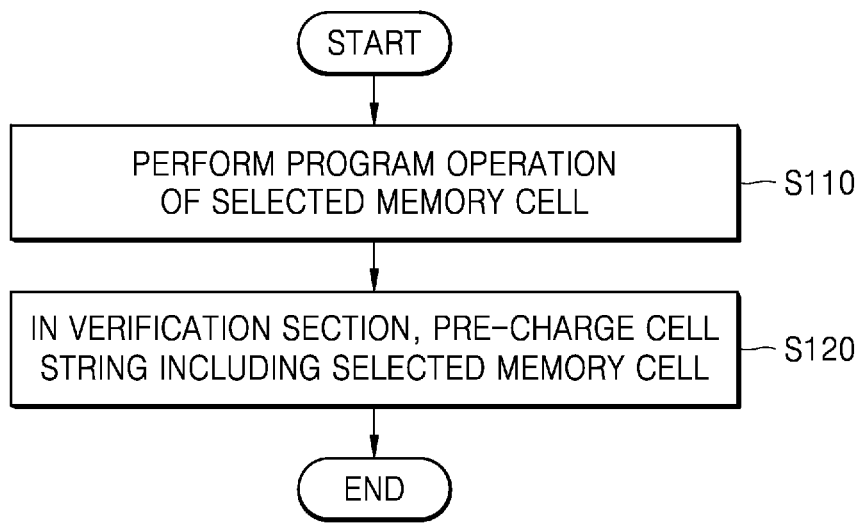
FIG. 16 is a flowchart of an operation method of a memory device, according to an example embodiment.

FIG. 16 is a flowchart of an operation method of a memory device, according to an example embodiment.

Referring to FIGS. 2 and 16, the memory device 100 may perform a program operation of a selected memory cell, in operation S110. For example, program loops may be performed according to the ISPP method, and each program loop may include a setup section, a program and verification section, and a recovery section. When the program operation of the selected memory cell is completed, the verification section may start.

In the verification section, the memory device 100 may pre-charge the cell string including the selected memory cell, in operation S120. According to the one or more embodiments, the memory device 100 may pre-charge a bit line connected to the cell string and pre-charge the common source line CSL to pre-charge the cell string.

The cell strings connected to one cell string and one bit line or all cell strings of the memory cell array 1000 may be pre-charged by the pre-charge manager 1510.

A voltage level, at which the cell strings are pre-charged, or a time taken to pre-charge the cell strings may be determined by the pre-charge manager 1510.

A pre-charge operation of the cell strings may be performed in any one of the program loops. In all program loops, the pre-charge operation of the cell strings may be performed at least once.

When the pre-charge operation of the cell strings is completed, the memory device 100 may perform the recovery operation.

Figure 17:
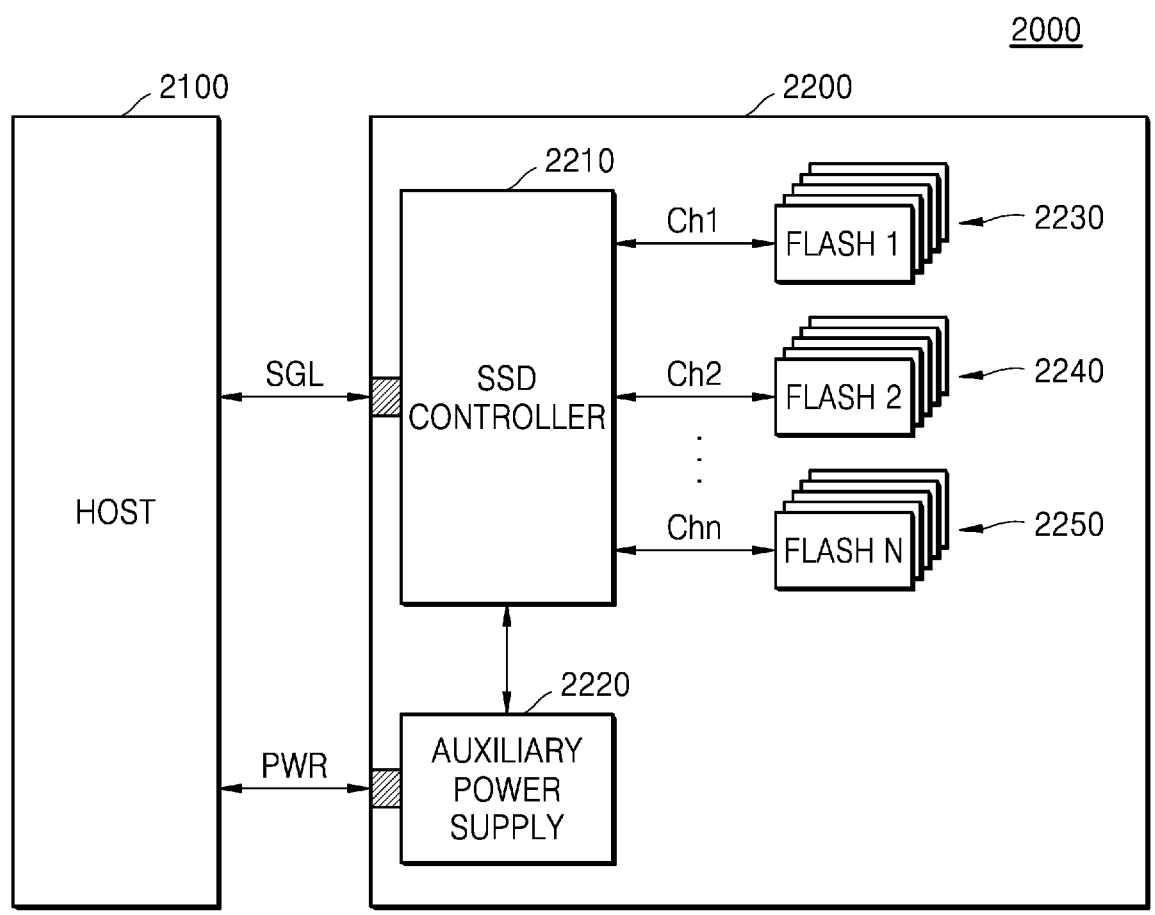
FIG. 17 is a block diagram of a solid state drive (SSD) system according to an example embodiment.

FIG. 17 is a block diagram of a solid state drive (SSD) system according to an example embodiment.

Referring to FIG. 17, an SSD system 2000 may include a host 2100 and an SSD 2200. The SSD 2200 may receive a signal from the host 2100 through a signal connector and power through a power connector. The SSD 2200 may include an SSD controller 2210, an auxiliary power supply 2220, and memory devices 2230, 2240, and 2250. The memory devices 2230, 2240, and 2250 may be vertically-stacked NAND flash memory devices. In this case, at least one of the memory devices 2230 to 2250 may be realized to pre-charge the cell strings and perform the recovery operation as described with reference to FIGS. 1 to 16.

While embodiments have been particularly shown and described with reference to embodiments thereof, it will be understood that various changes in form and details may be made therein without departing from the spirit and scope of the following claims.

What is claimed is:

1. A non-volatile memory device comprising:
a memory cell array comprising a plurality of cell strings, wherein each cell string of the plurality of cell strings includes a string selection transistor, a plurality of memory cells, and a ground selection transistor connected in series between a bit line and a common source line; and
a control circuit configured to:
perform a program operation on a selected memory cell from among the plurality of memory cells,
pre-charge a selected cell string comprising the selected memory cell in a pre-charge section included in a verification section, and
apply, in the pre-charge section, a first voltage to a selected word line of the selected memory cell, a second voltage to a plurality of unselected word lines of remaining memory cells of the plurality of memory cells, and a third voltage to a plurality of adjacent word lines which are adjacent to the selected word line from among the plurality of unselected word lines, the third voltage being different from the second voltage, and a level of the second voltage being higher than a level of the first voltage,
wherein the selected cell string is pre-charged as a first pre-charge voltage is applied to a selected bit line connected to the selected memory cell, and
wherein the plurality of adjacent word lines comprise a first adjacent word line which is immediately adjacent to the selected word line on a first side, and a second adjacent word line which is immediately adjacent to the selected word line on a second side.

2. The non-volatile memory device of claim 1, further comprising a page buffer connected to the selected bit line and comprising a plurality of transistors configured to apply the first pre-charge voltage to the selected bit line.

3. The non-volatile memory device of claim 1, wherein the level of the first voltage is lower than the level of the second voltage.

4. The non-volatile memory device of claim 1, wherein a level of the third voltage is equal to a level of the first voltage.

5. The non-volatile memory device of claim 1, wherein the control circuit is further configured to apply a pre-pulse voltage to a plurality of string selection transistors of the memory cell array for a first time and apply a turn-off voltage for a second time in a section of the verification section other than the pre-charge section, and to apply a turn-on voltage to the plurality of string selection transistors in the pre-charge section.

6. The non-volatile memory device of claim 1, wherein the control circuit is further configured to apply a pre-pulse voltage to an unselected string selection transistor not connected to the selected memory cell for a first time, and to apply a turn-off voltage to the unselected string selection transistor for a second time in a section of the verification section other than the pre-charge section, and to apply a turn-on voltage to the unselected string selection transistor in the pre-charge section.

7. The non-volatile memory device of claim 1, wherein a voltage of the common source line comprises one of a first voltage or a floating voltage, according to whether the ground selection transistor is turned on.

* * * * *